US012776765B2

(12) United States Patent
Margalit et al.

(10) Patent No.: US 12,776,765 B2
(45) Date of Patent: Oct. 27, 2026

(54) METHOD AND DEVICE FOR GENERATING A BUS OF RANDOMLY DISTRIBUTED SIGNALS

(71) Applicant: NEXT SILICON LTD., Givatayim (IL)

(72) Inventors: Oded Margalit, Ramat Gan (IL); Elad Shliselberg, Ramat Gan (IL)

(73) Assignee: NEXT SILICON LTD., Givatayim (IL)

( * ) Notice: Subject to any disclaimer, the term of this patent is extended or adjusted under 35 U.S.C. 154(b) by 0 days.

(21) Appl. No.: 19/091,176

(22) Filed: Mar. 26, 2025

(65) Prior Publication Data

US 2026/0303074 A1 Oct. 1, 2026

(51) Int. Cl.
*H03K 3/84* (2006.01)
*G06F 7/58* (2006.01)

(52) U.S. Cl.
CPC ............... *H03K 3/84* (2013.01); *G06F 7/582* (2013.01)

(58) Field of Classification Search
CPC ................................................ G06F 7/58–588
See application file for complete search history.

(56) References Cited

U.S. PATENT DOCUMENTS 3,961,169 A * 6/1976 Bishop ...................... G06F 7/58 708/250
5,043,988 A * 8/1991 Brglez ........... G01R 31/318385 714/739
2022/0164165 A1* 5/2022 Marangon ................. G06F 7/58

OTHER PUBLICATIONS

D.T. Lee et al., Algorithms for Generating Probabilities with Multivalued Stochastic Relay Circuits, IEEE Transactions on Computers , vol. 64, No. 12, 2015 (Year: 2015).*
D. Wilhelm et al., Stochastic Switching Circuit Synthesis, found at https://rutcor.rutgers.edu/Bruck.pdf, 2008 (Year: 2008).*

* cited by examiner

*Primary Examiner* — Emily E Larocque
(74) *Attorney, Agent, or Firm* — The Roy Gross Law Firm, LLC; Roy D. Gross

(57) ABSTRACT

A device for generating a bus of randomly distributed binary signals {S1, S2, . . . Sk}, defined by a vector VN of respective, required, real-number probabilities {(P1/N), . . . , (Pk/N)}, includes an approximation circuit, configured to receive one or more first, Independent, and Identically Distributed (IID) binary signals, and generate therefrom a random, binary approximation signal. The probability of the binary approximation signal is biased based on an integer common denominator N. The device further includes one or more complementary circuits, each configured to receive (i) the binary approximation signal, and (ii) at least one second IID binary signal, and generate therefrom at least one random, binary complementary signal. The device further includes an integration circuit, configured to produce the random binary signals {S1, S2, . . . Sk}, based on the approximation signal and the one or more complementary signals, in accordance with the vector VN of required probabilities.

13 Claims, 9 Drawing Sheets

PRIOR ART

10INT

| 10CS 2 | 10CS 1 | 10CS 0 | S1 | S2 | S3 | S4 | S5 |
|---|---|---|---|---|---|---|---|
| | | | V5 (FIRST VERSION) | | | | |
| 1 | 0 | 0 | 1 | 0 | 0 | 0 | 0 |
| 0 | 0 | 0 | 0 | 1 | 0 | 0 | 0 |
| 0 | 0 | 1 | 0 | 0 | 1 | 0 | 0 |
| 0 | 1 | 0 | 0 | 0 | 0 | 1 | 0 |
| 0 | 1 | 1 | 0 | 0 | 0 | 0 | 1 |

METHOD AND DEVICE FOR GENERATING A BUS OF RANDOMLY DISTRIBUTED SIGNALS

FIELD OF THE INVENTION

The present invention relates generally to fundamental electronic devices and circuits. More specifically, the present invention relates to methods and devices for generating randomly distributed signals.

BACKGROUND OF THE INVENTION

In the field of electronic devices and circuits, generating randomly distributed signals is a fundamental task with wide-ranging applications, such as system optimization and resource management. Traditional methods for creating non-binary probability distributions from random bits often rely on relatively complex to compute processes, like modulo operations, which can be inefficient when implemented in hardware. These methods usually result in large circuit areas and significant delays, making them less practical for high-speed applications.

The term "non-binary" may be used herein to indicate probability distributions where the outcomes may not be accurately expressed by rational combinations of powers of two. In other words, a non-binary probability cannot be accurately represented as a rational fraction, with a denominator of a power of two. For example, a distribution that assigns probabilities to three outcomes such as (½, ⅓, ⅙), is considered non-binary because it involves probabilities (e.g., ⅙) that may not be expressed by a rational fraction, with a denominator of a power of two, such as ½, ¼, ⅛ etc.

As discussed herein, currently available hardware solutions fail to efficiently produce signals with non-binary probability distributions, leading to inaccuracies and excessive consumption of computational resources, such as area, propagation time and throughput.

SUMMARY OF THE INVENTION

According to an aspect of the present disclosure, a device, or circuit for generating a bus of randomly distributed binary signals {S1, S2, . . . Sk} is provided. The bus of randomly distributed binary signals may be defined by a vector VN of respective, required, rational-number probabilities {(P1/N), (P2/N), . . . , (Pk/N)}.

According to some embodiments, the device or circuit (used herein interchangeably) may include an approximation circuit, configured to receive one or more first, Independent, and Identically Distributed (IID) binary signals, and generate therefrom a random, binary approximation signal, where a probability of the binary approximation signal is biased based on an integer common denominator N.

The device may also include one or more complementary circuits, each configured to receive (i) the binary approximation signal, and (ii) at least one second IID binary signal, and generate therefrom at least one random, binary complementary signal.

The device may further include an integration circuit, configured to produce the random binary signals {S1, S2, . . . Sk}, based on the approximation signal and the one or more complementary signals, in accordance with the vector VN of required probabilities.

As explained herein, {P1, P2, . . . , Pk} and N may be integer numbers, and at least one of the required probabilities {(P1/N), (P2/N), . . . , (Pk/N)} may be non-binary in a sense that it cannot be accurately represented as rational combination of powers of 2. The approximation circuit may be configured to generate binary values of the approximation signal at an approximated probability (P*1/2n), which best approximates probability (P1/N) of a first random binary signal S1 of the bus of random binary signals {S1, S2, . . . Sk}, given a predetermined number of bits n. The one or more complementary signals may be adapted to complement the probability of the binary approximation signal, in accordance with the required probabilities {(P2/N), . . . , (Pk/N)} of signals {S2, . . . Sk} of the bus of random binary signals {S1, S2, . . . Sk}.

According to some embodiments, the approximation circuit may include one or more factorization stages. Each factorization stage may (a) pertain to a respective step of iterative factorization of the approximated probability (P*1/2n), and (b) may be adapted to produce one or more contributory signals, representing that step of iterative factorization. As explained herein, the approximation circuit may further generate the approximation signal based on the one or more contributory signals of the factorization stages.

Additionally, or alternatively, the approximation circuit may include one or more halving stages, where each halving stage (a) pertains to a respective step of iterative halving of the approximated probability (P*1/2n), and (b) is adapted to produce one or more contributory signals, representing that step of iterative halving. The approximation circuit may be adapted to generate the approximation signal based on the one or more contributory signals of the halving stages.

According to some embodiments, the device or circuit may be connected with one or more hardware components (denoted herein M1, . . . , M5) via the bus of random binary signals, and may be adapted to generate the bus's random binary signals so as to select or enable the one or more hardware components in accordance with the vector VN of required probabilities.

According to another aspect of the invention, an Integrated Circuit (IC) is provided. The IC may include a first device as described above, and one or more second devices as described above. The integration circuit of the first device or second device may be configured to produce the random binary signals {S1, S2, . . . Sk} as a combination of the approximation signals and complementary signals of the first device and the one or more second devices, in accordance with the vector VN of required probabilities.

Additionally, or alternatively, the IC may further include one or more hardware components, associated with the first device and the one or more second devices via their respective buses of randomly distributed binary signals. The IC may thus be configured to enable selection or function of the one or more hardware components in accordance with said combination of vectors VN of required probabilities.

According to another aspect of the present disclosure, a method of producing, by at least one processor, an Integrated Circuit (IC) is provided. The method includes calculating, or generating an approximation circuit schematic, representing an approximation circuit, adapted to receive one or more first IID binary signals, and generate therefrom a randomly distributed binary approximation signal.

The method may also include calculating, or generating one or more complementary schematics, respectively representing one or more complementary circuits, wherein each complementary circuit is configured to receive (i) the binary approximation signal, and (ii) at least one second IID binary signal, and generate therefrom at least one respective random, binary complementary signal.

Additionally, or alternatively, the method may include calculating an integration schematic, representing an integration circuit, configured to produce a bus of random binary signals, having required, non-binary probabilities, based on the approximation signal and the one or more complementary signals.

Additionally, or alternatively, the method may include obtaining one or more schematics, representing one or more respective hardware components, intended to be integrated within the IC, and configuring the integration circuit to select, or enable the one or more hardware components, via the bus of random binary signals, based on the required, non-binary probabilities.

The schematics may be translatable, or adapted to be translated, into a physical layout design, utilizable for fabricating the IC, as known in the art.

According to another aspect of the present disclosure, a system for producing an Integrated Circuit (IC) is provided.

Embodiments of the system may include a non-transitory memory device, wherein modules of instruction code are stored, and at least one processor associated with the memory device, and configured to execute the modules of instruction code.

Upon execution of said modules of instruction code, the at least one processor may be configured to perform operations. The operations may include calculating an approximation circuit schematic, representing an approximation circuit, adapted to receive one or more first IID binary signals, and generate therefrom a randomly distributed binary approximation signal.

The operations may also include calculating one or more complementary schematics, respectively representing one or more complementary circuits, where each complementary circuit is configured to receive (i) the binary approximation signal, and (ii) at least one second IID binary signal, and generate therefrom at least one respective random, binary complementary signal.

The operations may further include calculating an integration schematic, representing an integration circuit, configured to produce a bus of random binary signals, having required, non-binary probabilities, based on the approximation signal and the one or more complementary signals.

Additionally, or alternatively, embodiments of the system may be further configured to obtain one or more schematics, representing one or more respective hardware components, intended to be integrated within the IC, and configure the integration circuit to select, or enable the one or more hardware components, via the bus of random binary signals, based on the required, non-binary probabilities.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 8 is a flow diagram, depicting a method of designing an electrical circuit, according to some embodiments of the invention.

Figure 1:
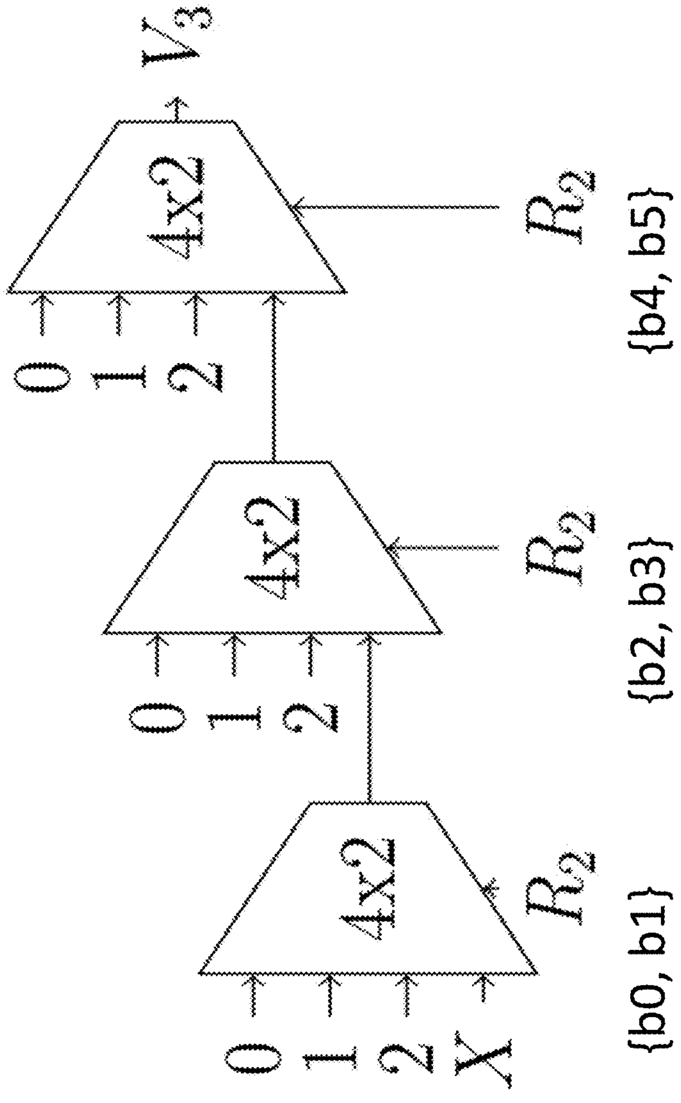
FIG. 1 is a schematic, logic-level diagram, depicting components of an electrical circuit, that may generate a signal having an approximated, non-binary random distribution, as known in the art.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention. Some features or elements described with respect to one embodiment may be combined with features or elements described with respect to other embodiments. For the sake of clarity, discussion of same or similar features or elements may not be repeated.

Although embodiments of the invention are not limited in this regard, discussions utilizing terms such as, for example, “processing,” “computing,” “calculating,” “determining,” “establishing”, “analyzing”, “checking”, or the like, may refer to operation(s) and/or process(es) of a computer, a computing platform, a computing system, or other electronic computing device, that manipulates and/or transforms data represented as physical (e.g., electronic) quantities within the computer's registers and/or memories into other data similarly represented as physical quantities within the computer's registers and/or memories or other information non-transitory storage medium that may store instructions to perform operations and/or processes.

Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. The term "set" when used herein may include one or more items.

Unless explicitly stated, the method embodiments described herein are not constrained to a particular order or sequence. Additionally, some of the described method embodiments or elements thereof can occur or be performed simultaneously, at the same point in time, or concurrently.

As used herein, a "distribution vector" (denoted $V_N$) may refer to a vector (e.g., a bus, a group, etc.) of parameters or signals, which are defined by an integer, common denominator. For example, a $V_3$ distribution vector may include a vector of three equally distributed signals (e.g., ⅓, ⅓, ⅓), or a vector of two biased signals (e.g., ⅔, ⅓). In another example, a $V_{60}$ distribution vector may be represented by two or more rational numbers (e.g., 7⁄12, 1⁄15, 1⁄20) whose common denominator N is 60.

In this context the terms "bus" and "vector", as an aggregation of signals, may be used interchangeably.

The term "biased" may be used herein to indicate a configuration of distribution vector $V_N$ whose signals are not evenly distributed in their probability. For example, a vector $V_N$ of two biased random signals {S1, S2} may be biased (e.g., ⅔, ⅓), in a sense that S1 may have a probability of ⅔ to have a specific binary value (e.g., '1'), whereas $S_2$ may have a probability of ⅓ to have that binary value ('1').

Lemma 1: One cannot generate a perfectly accurate, non-binary distribution vector (e.g., $V_3$, such as ⅓, ⅓, ⅓), with any finite number of equally distributed (e.g., ½, ½) random bits.

Proof, pertaining to the example of N=3: Any process that uses equally distributed random bits, and is guaranteed to yield a random $V_3$ output based on n input bits, can be viewed as a mapping function from $\{0, 1\}^n$ to $\{0, 1, 2\}$. Since $2^n$ is not divisible by 3, the output cannot exhibit an accurate $V_3$ distribution. It may be appreciated that Lemma 1 can be generalized to any probability distribution which includes at least one element that cannot be expressed as an integer over a power of 2.

Reference is now made to FIG. 1, which is a schematic, logic-level diagram, depicting components of an electrical circuit, adapted to generate a signal having an approximated, non-binary random distribution, as known in the art.

Some currently available solutions may approximate non-binary distribution vectors, such as $V_3$, by calculating a random number using modulo N (e.g., modulo 3), using n bits. While this method can provide the best possible approximation with n bits, it has two major drawbacks:

Firstly, integer division is resource-intensive, requiring substantial hardware and silicon area. Secondly, the depth of an integer division circuit is of order O(n), which introduces latency and limits the clock rate.

One approach to address the first problem is illustrated in FIG. 1, which shows the generation of a $V_3$ distribution vector. In this method, six input bits are processed in pairs ($R_2$) denoted {b0, b1}, {b2, b3}, {b4, b5}.

When the integer value of a pair falls within the range [0, 2], it is selected as the output. Otherwise, the process is repeated recursively with the remaining bits. This technique approximates distribution vector $V_3$ to (21⁄64, 21⁄64, 22⁄64) which is the best approximation achievable using 6 random bits. However, the second issue persists: the circuit's depth remains a challenge.

Figure 2A:
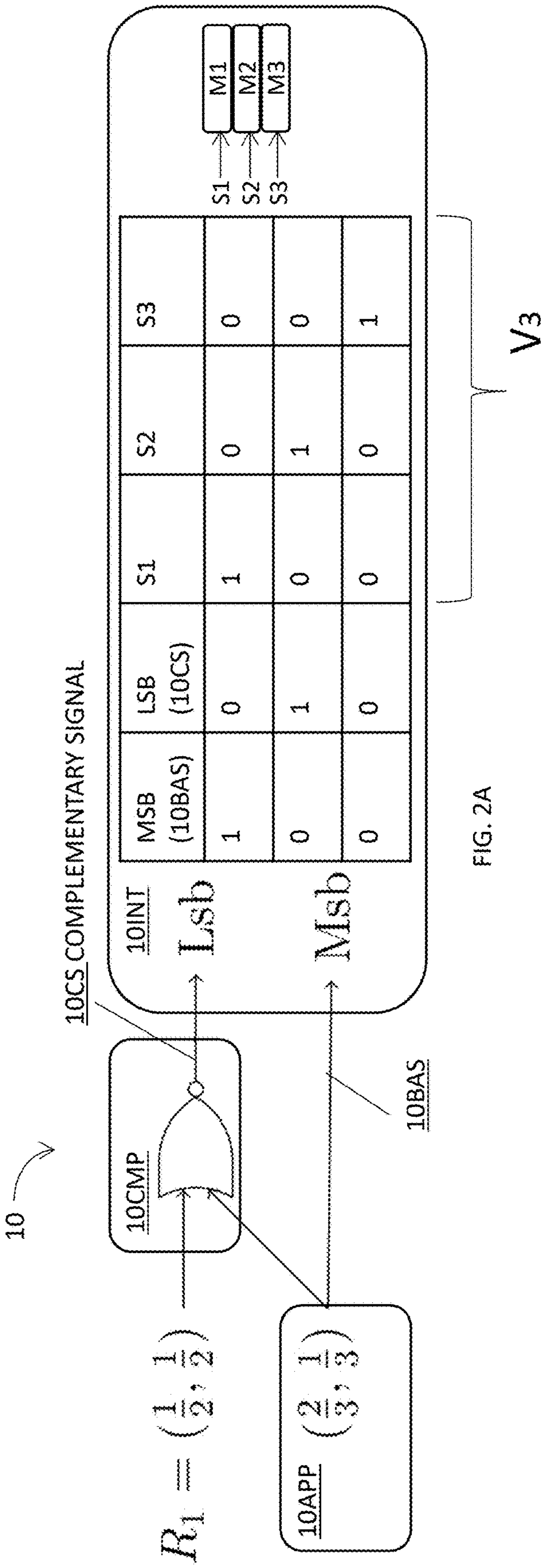
FIGS. 2A and 2B are schematic, logic-level diagrams, depicting an example of components of an electrical circuit that may generate a vector of random signals, approximating a required, non-binary random distribution, according to some embodiments of the invention.
Figure 2B:
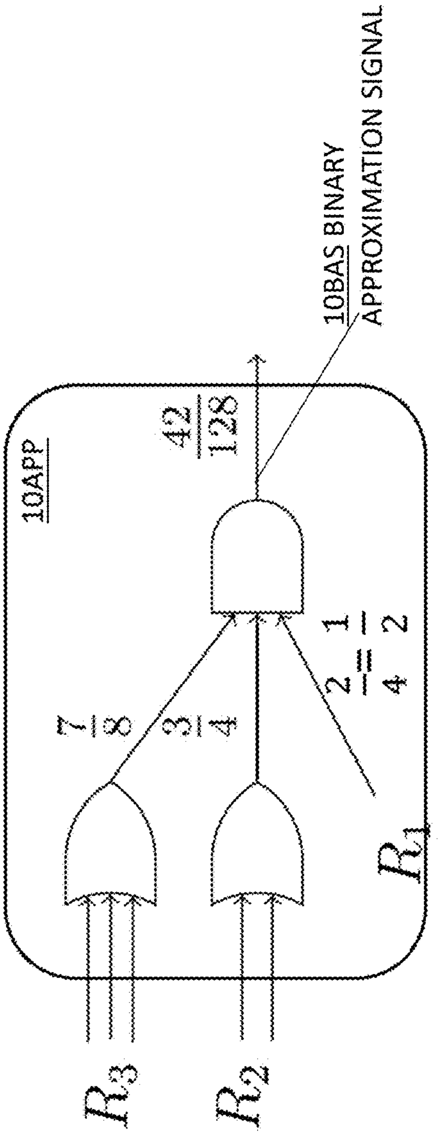

Reference is now made to FIGS. 2A and 2B which are schematic, logic-level diagrams, depicting an example of components of an electrical circuit 10. Circuit 10 may be adapted to generate a vector of random signals, approximating a required, non-binary random distribution, according to some embodiments of the invention.

In the example of FIGS. 2A and 2B, circuit 10 may generate distribution vector $V_3$ as a bus of random binary signals $\{S_1, S_2, \ldots S_k\}$ (in this case k=3). As explained herein, embodiments of the invention may do so while mitigating the issue of the circuit's O(n) order.

Distribution vector $V_N$ (e.g., $V_3$) may be defined by respective required, rational-number probabilities $\{(P_1/N), (P_2/N), \ldots, (P_k/N)\}$ (e.g., ⅓, ⅓, ⅓), where $\{P_1, \ldots, P_k\}$ and the common denominator N are integer numbers. Required probabilities $\{(P_1/N), (P_2/N), \ldots, (P_k/N)\}$ may be non-binary in a sense that they cannot be accurately represented as rational combinations of powers of 2 (e.g., ½, ¼, ⅛, etc.). In other words, required probabilities $\{(P_1/N), (P_2/N), \ldots, (P_k/N)\}$ may be non-binary in a sense that N is not a power of 2.

As explained herein, circuit 10 may be implemented as an independent hardware device.

Additionally, or alternatively, circuit 10 may be included as part of a device or system, such as a semiconductor Integrated Circuit (IC). For example, circuit 10 may be employed on an IC device to select, or enable one or more other on-chip or peripheral modules (denoted M1, M2, M3), according to a predefined probability distribution (e.g., ⅓, ⅓, ⅓).

The terms "circuit 10" and "device 10" may therefore be used interchangeably in this context.

Circuit 10 may be configured to receive, or produce Independent, and Identically Distributed (IID) random binary signals, as known in the art. Binary IID random signals may be identically distributed in a sense that they may exhibit binary values (e.g., '1' and '0') having substantially equal probabilities. The IID signals are denoted herein as Ri, where 'R' represents their random property, and i represents a width (e.g., a number of bits) of each binary, random IID signal.

For example, circuit 10 may include, or may be communicatively connected to a microcontroller, adapted to produce the IID signals by dedicated software, as known in the art. Additionally, or alternatively, circuit 10 may include, or may be associated with one or more hardware modules, such as a Pseudorandom Binary Sequence (PRBS) Generator, adapted to produce the IID signals as known in the art.

As shown in FIG. 2A, circuit 10 may include an approximation circuit 10APP, at least one complementary circuit 10CMP, and an integration circuit 10INT.

As shown in FIG. 2B, approximation circuit 10APP may be configured to receive one or more first, IID binary signals, and generate therefrom a randomly distributed, binary approximation signal 10BAS. A probability of the binary approximation signal 10BAS may be biased based on the integer common denominator N.

In other words, approximation circuit 10APP may reduce the problem to generating a biased signal, with a probability distribution that reflects the common denominator N.

For example, binary approximation signal 10BAS may be biased according to the common denominator N, in a sense that the probability distribution of binary approximation signal 10BAS may be defined by probability values (e.g., $$\left(\text{e.g.,}\left(\frac{1}{N},\ \frac{N-1}{N}\right)\right),$$

represented by rational numbers, whose common denominator is N. Pertaining to the example of FIGS. 2A and 2B (where N=3), the probability distribution (e.g., the probabilities for each binary value) of biased, binary approximation signal 10BAS is (⅓, ⅔).

The at least one complementary circuit 10CMP may each receive (i) the binary approximation signal 10BAS, and (ii) at least one IID binary signal (denoted '$R_1$' in the example of FIG. 2A), and generate therefrom at least one random, binary complementary signal 10CS.

The term "complementary" may be used in this context to indicate completion of required probability distribution of vector $V_N$. In other words, the probability of a binary value (e.g., '1') of signal(s) 10CS may match that of approximation signal 10BAS, so as to obtain the required probability distribution of signals $\{S_1, \ldots, S_k\}$ of vector $V_N$ either directly, or via additional logic functions, as elaborated herein.

For example, approximation circuit 10APP may generate binary approximation signal 10BAS having a probability distribution that is biased according to common denominator N (e.g., $$\left(\text{e.g.,}\left(\frac{1}{N},\ \frac{N-1}{N}\right),\right.$$

and complementary circuit 10CMP produce one or more complementary signals 10CS that complement the distribution of binary approximation signal 10BAS, according to predetermined requirements.

In the example of FIG. 2A, at least one complementary circuit 10CMP may use the biased, binary approximation signal 10BAS to generate a complementary signal 10CS that may complement distribution vector $V_N$ (e.g., $V_3$), according to a requirement of evenly distributed probabilities (⅓, ⅓, ⅓).

When biased, binary approximation signal 10BAS is '0' (with probability-), then the Most Significant Bit (MSB) will be '0', and complementary signal 10CS (denoted Least Significant Bit (LSB)) will independently be $\in\{0, 1\}$, with (½, ½) probability. When MSB is '1' (with probability ⅓), LSB will be '0'.

In other words, the combinations of signals MSB (=10BAS) and LSB (=10CS) may include the following values: {1,0}; {0,0} and {0,1}, having evenly distributed probabilities (⅓, ⅓, ⅓), as required.

Integration circuit 10INT may be configured to produce the random binary signals $\{S_1, S_2, \ldots, S_k\}$ of distribution vector $V_N$ based on approximation signal 10BAS and the one or more complementary signals 10CS, in accordance with the required probabilities of distribution vector $V_N$.

In the example of FIG. 2A, integration circuit 10CS may implement the truth table as depicted in FIG. 2A, to produce distribution vector $V_3$, as shown in the set of equations below:

$S_1$=10BAS $S_2$=NOT (10BAS) AND 10CS $S_3$=NOT (10BAS) AND NOT (10CS),

As elaborated further herein, integration circuit 10CS may include other, non-trivial architecture, to facilitate different, predefined implementations of distribution vector $V_N$.

As explained herein, approximation circuit 10APP may generate a random, binary approximation signal 10BAS, whose approximated probability is biased, based on the integer common denominator N (e.g., ⅔, ⅓).

In the example of FIGS. 2A and 2B, the equally distributed (⅓, ⅓, ⅓) probability of distribution vector $V_3$ was implemented using seven IID bits: One bit was used by complementary circuit 10CMP, while the other six bits were used by approximation circuit 10APP, for generating a ($\frac{42}{64}$, $\frac{21}{64}$) distribution, which is the best 6-bit approximation for a (⅔, ⅓) distribution.

In order to establish the composition of approximation circuit 10APP, the dividend (42) was factored to its prime components: 2, 3 and 7 (42=2·3·7). Each component was assigned a logical function (e.g., an AND gate, an OR gate), adapted to receive as input a number of IID signals, corresponding to representation of its respective divisor.

In the example of FIG. 2B, (i) prime component 7 was assigned a 3-bit AND gate (3 bits are required to represent 8 values), (ii) prime component 3 was assigned a 2-bit AND gate (2 bits are required to represent 4 values), and (iii) prime component 2 was assigned a trivial (e.g., wire) gate (1 bit is required to represent 2 values). The output of these gates was combined as shown, to generate the ($\frac{86}{128}$, $\frac{42}{128}$) distribution of approximation signal 10BAS.

As depicted in FIG. 2B, six bits were used to express the probability, as calculated in relation to the 128 ($2^7$) divisor. That's because the seventh bit was used by complementary circuit 10CMP of FIG. 2A, to convert the (⅓, ⅔) distribution of approximation circuit 10APP to the equally distributed (⅓, ⅓, ⅓) probabilities of vector $V_3$.

The inventors have implemented circuit 10 of FIGS. 2A and 2B in hardware, as a semiconductor device. The inventors have also implemented a modulo-3 divider, as a baseline for comparison with currently available, naïve solutions. The inventors have found that device 10 of the present invention was both (a) smaller in terms of area consumption by a factor of ×10, and (b) shallower, in terms of gate propagation, in relation to the baseline modulo-3 device.

Reference is now made to FIGS. 3A-3D which are schematic, logic-level diagrams, depicting another example of an electrical circuit 10, that may generate a vector $V_N$ (e.g., $V_5$) of random signals (e.g., {S1, . . . , S5}), approximating a required, non-binary random distribution (e.g., ⅕, ⅕, ⅕, ⅕, ⅕), according to some embodiments of the invention.

Figure 3A:
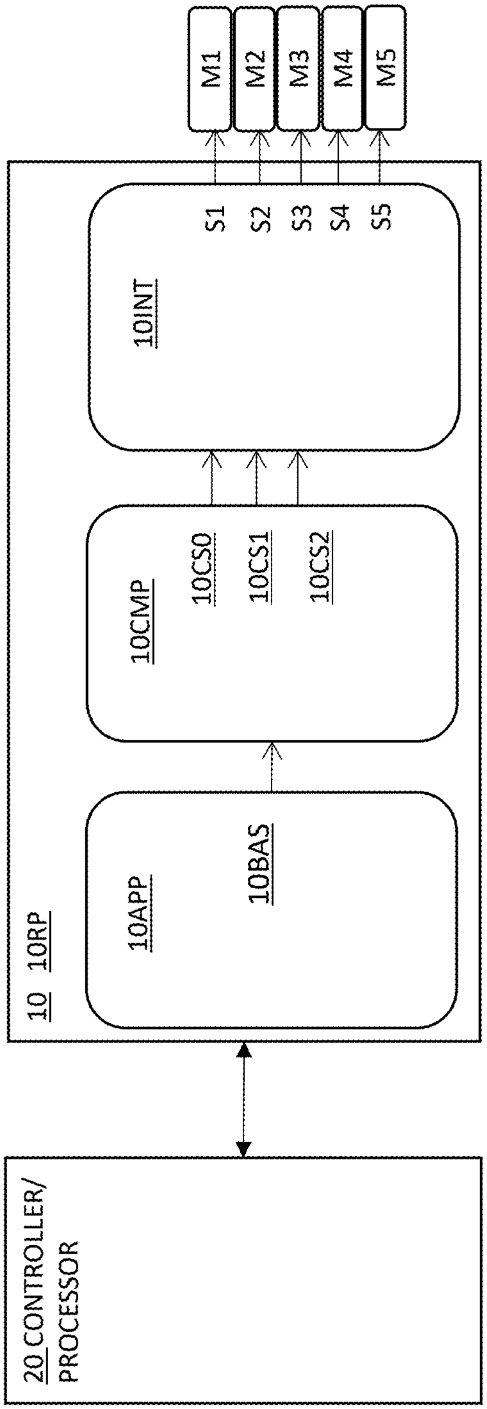
FIGS. 3A-3D are schematic, logic-level diagrams, depicting another example of components of an electrical circuit, that may generate a vector of random signals, approximating a required, non-binary random distribution, according to some embodiments of the invention.

In the example of FIG. 3A, circuit 10 comprises: (a) an approximation circuit 10APP, adapted to generate a biased approximation signal 10BAS, (b) a complementary circuit 10CMP, adapted to generate one or more (e.g., three) complementary signals 10CS (denoted 10CS-2, 10CS-1, 10CS-0) based on approximation signal 10BAS, and (c) an integration circuit 10INT, adapted to produce random signals (e.g., {S1, . . . , S5}) of distribution vector $V_5$, based on complementary signals 10CS and biased approximation signal 10BAS.

As shown in the examples of FIGS. 3B-1, 3B-2 and 3B-3, approximation circuit 10APP may be adapted to receive 8 IID signals (denoted $R_4$, $R_2$, $R_1$, $R_1$), and produce therefrom an approximation signal 10BAS having a biased probability distribution $$\left(\frac{1}{N}, \frac{N-1}{N}\right),$$

in accordance with the common denominator N=5 (in this example: (1/5, 4/5)).

According to some embodiments, approximation circuit 10APP may be configured to generate binary values of approximation signal 10BAS at a probability $(P^*_1/2^n)$, where $P^*_1$ and n are integer numbers. Probability $(P^*_1/2^n)$ may best approximate a requested probability $(P_1/N)$ of a first random binary signal $S_1$ of distribution vector $V_N$ (e.g., the bus of random binary signals $\{S_1, S_2, \ldots S_k\}$), given a predetermined number of bits n.

Figures 1, 3B:
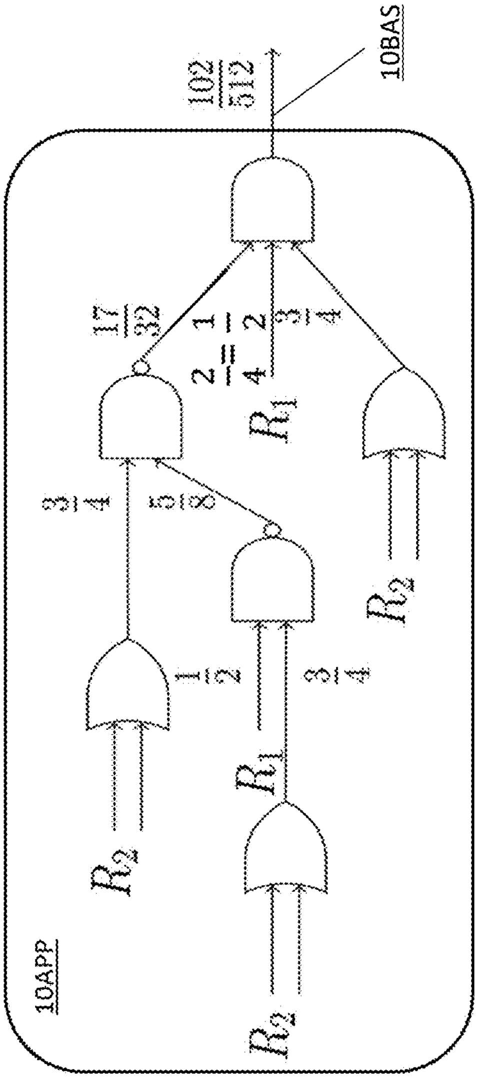

In the example of FIG. 3B-1, the requested probability $(P_1/N)$ of a first random binary signal $S_1$ of distribution vector $V_N$ is 1/5. The best approximation of a 1/5 probability using 8 bits is $$\frac{51}{256}\left(=\frac{204}{1024}\right).$$

Therefore, approximation circuit 10APP may generate binary values of approximation signal 10BAS at a probability $(P^*_1/2^n)$, where $P^*_1$ is 51, and n is 8 (i.e., $51/2^8$).

In the example of FIGS. 3A-3D, circuit 10 may use 10 IID signals (eight in approximation circuit 10APP, and two more in complementary circuit 10CMP) to produce signals $\{S_1, S_2, S_3, S_4, S_5\}$ of distribution vector $V_5$. In this example, distribution vector $V_5$ exhibits a distribution of approximated probability $\{(P^*_1/2^n), (P^*_2/2^n), (P^*_3/2^n), (P^*_4/2^n), (P^*_5/2^n)\}$, that is equal to $\{(51/2^8\text{-}204/2^{10}), (205/2^{10}), (205/2^{10}), (205/2^{10}), (205/2^{10})\}$. This roughly yields the following probability values: {19.92%, 20.02%, 20.02%, 20.02%, 20.02%}. These values best match the required probability distribution of $\{(P_1/N), (P_2/N), (P_3/N), (P_4/N), (P_5/N)\}$=(1/5, 1/5, 1/5, 1/5, 1/5)), using 10 TID bits. It may be appreciated by a person skilled in the art that additional IID signals may be used in approximation circuit 10APP, to improve accuracy of the approximated probability distribution.

Implementation of approximation circuit 10APP of FIG. 3B-1 may be similar in principle to that of the approximation circuit 10APP of FIG. 2B. As explained above, approximation signal 10BAS may represent the best approximation of a biased, 1/5 probability using 8 bits i.e., 102/512. In order to establish the composition of approximation circuit 10APP of FIG. 3B-1, an iterative factorization process may be used. In the first iteration, the dividend of the output stage (102) was factored to its prime components: 17, 2 and 3 (102=17·2·3).

In a subsequent iteration, and as shown in the example of FIG. 3B-1, a NOT gate was used, in order to change the prime number 17 to its binary composite number 15 ($2^5$-17=15). The new dividend (15) was further factorized to its prime components 5 and 3, resulting in an additional logical stage, along the branch of the '17' component.

In the following iteration, another NOT gate was used, to change the prime number 5 to its binary composite number 3 ($2^3$−5=3), resulting in yet another logical stage in the branch of the '17' component.

This iterative process may proceed until the dividend of the output stage (in this example, 102) is factorized to its minimal components, resulting in a series of factorization stages.

As shown in FIGS. 3B-1, 3B-2 and 3B-3, each prime component was assigned a logical function (e.g., an AND gate, an OR gate), adapted to receive as input a number of IID signals, corresponding to representation of its respective divisor.

It may be appreciated that other, similar logical techniques may be employed in order to approximate all probability distributions using only random, evenly distributed (1/2, 1/2) IID bits. As explained herein, embodiments of the invention (e.g., module 110, discussed below in relation to FIG. 7) may be adapted to generate a composition of approximation circuit 10APP, to optimize approximation circuit 10APP according to predetermined criteria of computation resource consumption.

Figures 3, 3B:
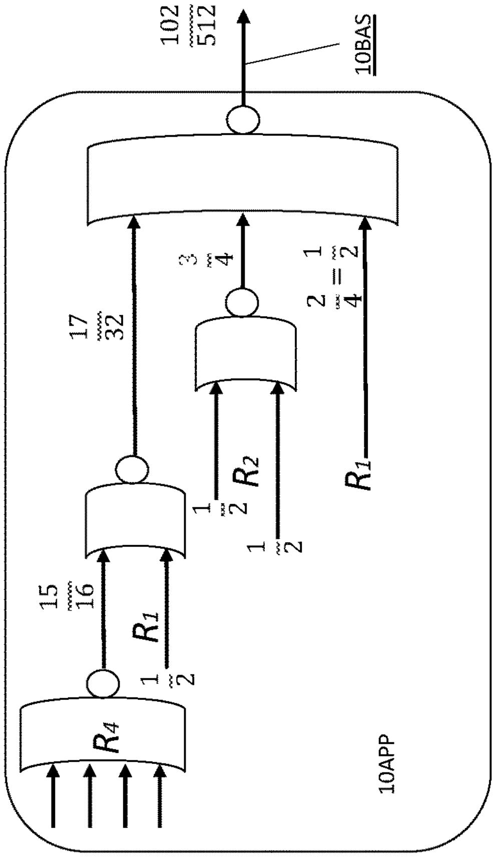
Figures 2, 3B:
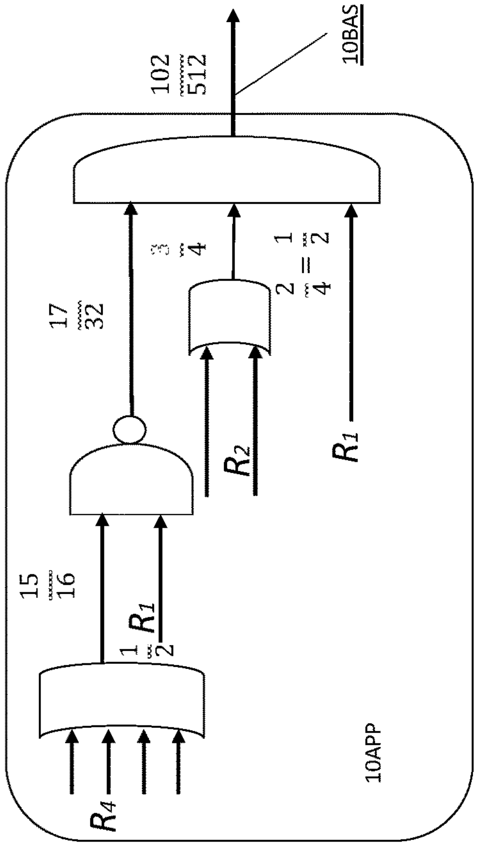

For example, as shown in FIG. 3B-2, embodiments of the invention may select a 4-input OR gate, to terminate the iterative process one step sooner than that of FIG. 3B-1. This selection may result in reduction of the depth of approximation circuit 10APP (in this example—from 4 to 3), leading to improved latency of device 10.

In another example, the De-Morgan law may be applied to produce alternative approximation circuits that exhibit equivalent statistical behaviour.

As known in the art, the De-Morgan law dictates that OR(X,Y)=NAND(NOT(X),NOT(Y)). It may be appreciated that in some applications, only the statistical behaviour of approximation signal 10BAS may be significant. In other words—the actual binary value ('0' or '1') may not be significant for the underlying application (e.g., selection of hardware, or load balancing between processes).

In such applications, OR(X,Y) may have a statistically equivalent behaviour to NAND(X,Y). In other words, when applying the De-Morgan law (i.e., changing OR(X,Y) to NAND(NOT(X),NOT(Y)), embodiments of the invention (e.g., module 110, discussed below) may remove the NOT gates to reduce latency, since a complementary (a NOT) of a random (1/2, 1/2) IID bit is also a valid random (1/2, 1/2) IID bit.

In yet another example, and as shown in FIG. 3B-3, embodiments of the invention (e.g., module 110, discussed below) may apply the De-Morgan law in conjunction with removal of NOT gates as explained above, to switch from AND/OR gates to corresponding NAND/NOR gates. This may allow further optimization of computational resource consumption, due to the fact that negative gates (NAND/NOR) are typically smaller in hardware (require less silicon area) than their positive counterparts (AND/OR gates).

Complementary circuit 10CMP may generate one or more complementary signals 10CS (e.g., 10CS-2, 10CS-1, 10CS-0), based on approximation signal 10BAS. The one or more complementary signals 10CS may complement the probability of binary approximation signal 10BAS, in accordance with the required probabilities $\{(P_2/N), \ldots, (P_k/N)\}$ of signals $\{S_2, \ldots S_k\}$ of distribution vector $V_N$.

Figures 3C, 3D:
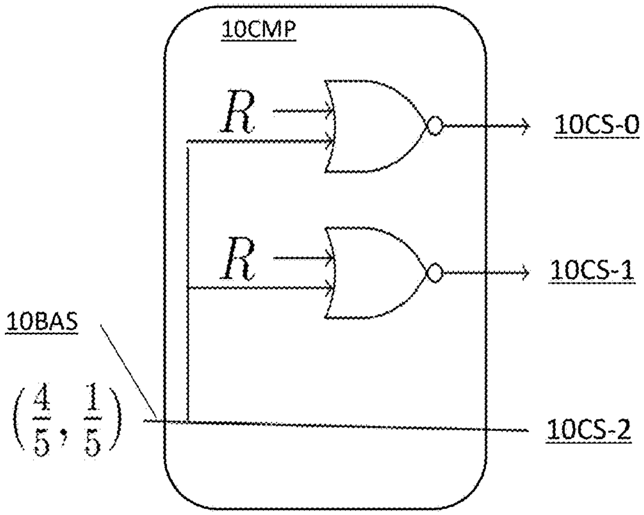

In the example of FIG. 3C, the MSB complementary signal 10CS-2 may be equal (e.g., directly connected) to approximation signal 10BAS. Complementary circuit 10CMP may thus emit signal 10CS-2 as '1' with a probability of 1/5, causing 10CS-1 and 10CS-0 to be '0'.

Signal 10CS-2 may be emitted as '0' with a probability of 4/5, causing 10CS-1 and 10CS-0 to be {0,0}; {0,1}; {1,0}; or {1,1} with equal probabilities.

As shown in FIG. 3D, integration circuit 10INT may implement the depicted truth table, to produce signals $\{S_1, \ldots S_5\}$ of distribution vector $V_5$, according to the following equations, to approximate the required probability distribution (⅕, ⅕, ⅕, ⅕, ⅕):

$S_1$=10CS2 (=10BAS)

$S_2$=NOT(10BAS) AND NOT(10CS1) AND NOT (10CS0)

$S_3$=NOT(10BAS) AND NOT(10CS1) AND(10CS0)

$S_4$=NOT(10BAS) AND(10CS1) AND NOT(10CS0)

$S_5$=NOT(10BAS) AND(10CS1) AND (10CS0)

Figure 4A:
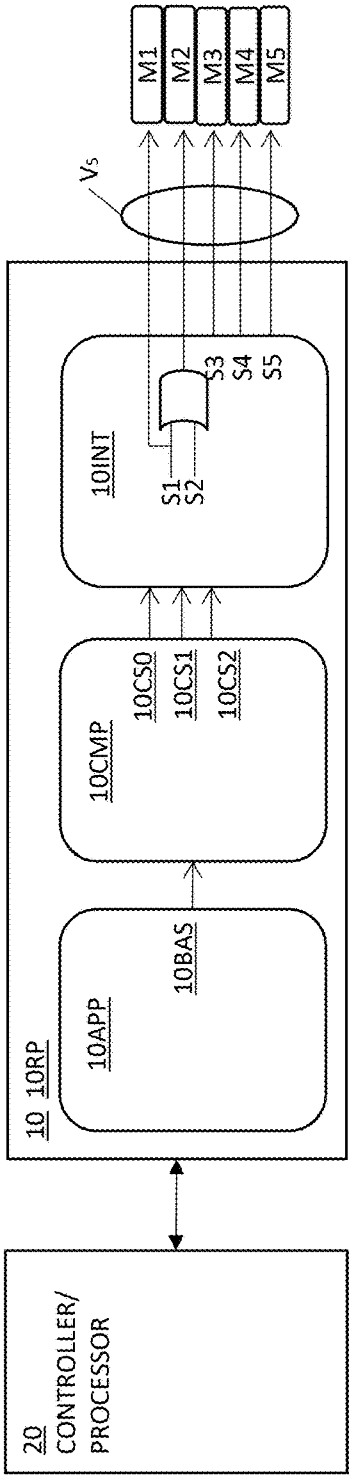
FIGS. 4A and 4B are schematic, logic-level diagrams, depicting other examples of an electrical circuit for generating a vector of random signals, approximating a required, non-binary random distribution, according to some embodiments of the invention.
Figure 4B:
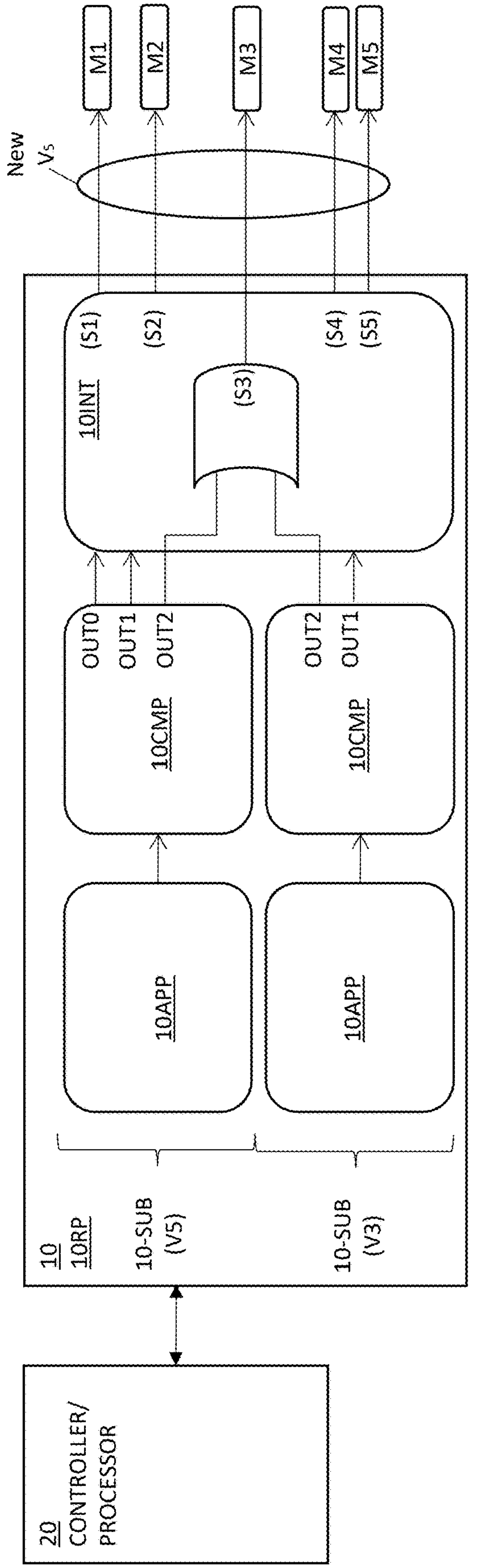

Reference also made to FIGS. 4A and 4B, which are schematic, logic-level diagrams, depicting other examples of an electrical circuit or device 10 for generating a vector of random signals, approximating a required, non-binary random distribution, according to some embodiments of the invention.

As shown in FIGS. 3A, 4A and 4B, device 10 may be connected with one or more hardware components or modules (denoted $M_1, \ldots, M_5$) via the bus $V_N$ of random binary signals $\{S_1, \ldots, S_k\}$. Device 10 may thereby generate the random binary signals $\{S_1, S_2, \ldots, S_k\}$ to select, or enable the one or more hardware components ($M_1, \ldots, M_5$) in accordance with required probabilities 10PP, as manifested by bus $V_N$.

For example, device 10 may be associated with one or more processors, or controllers 20, adapted to manage hardware components $M_1, \ldots, M_5$ to perform predetermined tasks. Device 10 may serve as an interface to hardware components $M_1, \ldots, M_5$, so as to equalize, or prioritize performance of the underlying tasks, in accordance with the required probabilities 10PP.

In another example, device 10 may be utilized by one or more processors 20 to enable, or select hardware components $M_1, \ldots, M_5$, which may be configured to perform a similar task, so as to perform load balancing among these hardware components, in accordance with the required probabilities 10PP.

In another example, components $M_1, \ldots, M_5$ may represent one or more memory devices such as High-Bandwidth Memory (HBM) modules. Device 10 may be utilized by one or more processors 20 to equalize, or prioritize access to these memory banks, in accordance with the required probabilities 10PP. In yet another example, device 10 may be utilized by one or more processors 20 to access memory devices $M_1, \ldots, M_5$ at a frequency, or an order that corresponds to required probabilities 10PP.

FIG. 4A depicts an electrical circuit 10 which may include the same approximation circuit 10APP and complementary circuit 10CMP as that of FIGS. 3A-3C. Integration circuit 10INT of FIG. 4A may be the same as integration circuit 10INT of FIG. 3D, except for an additional logic element, such as an OR gate, applied to output signals $S_1$ and $S_2$.

It may be appreciated that the additional logic element may be used to modify the probability distribution of output signals $S_i$ of circuit 10, according to requirement. In the example of FIG. 4A, the probability distribution of signals $\{S_1, \ldots S_5\}$ of vector $V_5$ may be modified to (⅕, ⅖, ⅕, ⅕, ⅕), to select or enable hardware modules $\{M_1, \ldots, M_5\}$, according to a desired configuration. Additional modifications are also possible.

FIG. 4B depicts an electrical circuit 10 which may include a combination of sub-devices or circuits 10 (denoted herein as 10-SUB), allowing additional permutations of probability distribution of signals $\{S_1, \ldots S_k\}$ of vector $V_N$.

For example, circuit 10 may be an Integrated Circuit (IC), which incorporates a first sub-circuit or device 10-SUB and one or more second sub-circuits or devices 10-SUB. The integration circuit of the first device 10-SUB may be configured to produce vector $V_N$ having a first bus of random binary signals $\{S_1, S_2, \ldots S_m\}$, exhibiting a first probability distribution. The integration circuit of the one or more second devices 10-SUB may be configured to produce vector $V_N$ having a second bus of random binary signals $\{S_1, S_2, S_n\}$, exhibiting a second probability distribution.

Integration circuit 10INT of circuit 10 may generate a new distribution vector $V_N$, based on the approximation signals 10BAS and/or complementary signals 10CS of sub-the first and/or second devices 10-SUB. The new distribution vector may exhibit a combination of probabilities, pertaining to the first device and the one or more second devices.

In the example of FIG. 4B, the first (top) device 10-SUB may be adapted to implement a V5 probability distribution, as discussed herein (e.g., in relation to FIGS. 3A-3D), whereas a second (bottom) device 10-SUB may be adapted to implement a V3 probability distribution, as discussed herein (e.g., in relation to FIGS. 2A, 2B). It may be appreciated that such configurations may produce distribution vectors $V_N$ that combine probabilities of member sub-devices 10_SUB: In the example of FIG. 4B, S3 will exhibit a '1'-value probability of $$1-\left(1-\frac{1}{5}\right)*\left(1-\frac{1}{3}\right)=\frac{7}{15}.$$

Figure 5A:
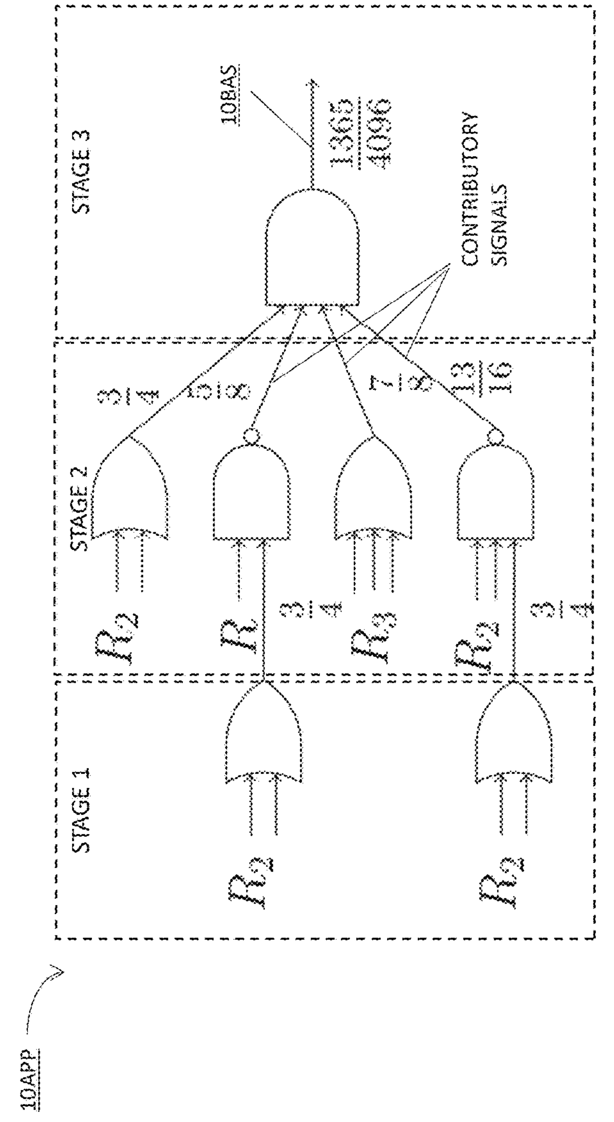
FIGS. 5A and 5B are schematic, logic-level diagrams, depicting two different examples for implementation of an approximation circuit, according to some embodiments of the invention.
Figure 5B:
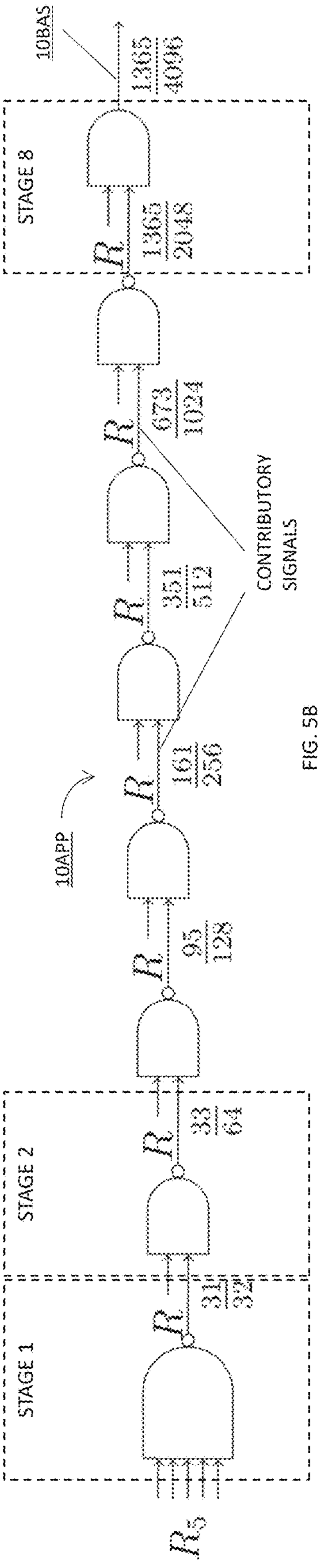

Reference is now made to FIGS. 5A and 5B, which are schematic, logic-level diagrams, each depicting an example for implementation of approximation circuit 10APP, according to some embodiments of the invention. Both implementations are set to generate an approximation signal 10BAS, approximating a '1'-value probability of ⅓, using 12 bits. The best approximated probability ($P^*_1/2^n$) in this example is 1365/4096. In other words, $P^*_1$ is 1365, and n is 12.

In the example of FIG. 5A, approximation circuit 10APP includes one or more factorization stages, which may be determined as discussed herein, e.g., in relation to FIGS. 2B and 3B-1). As shown in FIG. 5A, each factorization stage pertains to a respective step of an iterative factorization process, set to factorize approximated probability ($P^*_1/2^n$) to its prime components. Each stage of the factorization process may be adapted to produce one or more interim, contributory signals, representing outcome(s) of that stage.

As shown in FIG. 5A (and discussed e.g., in relation to FIGS. 2B and 3B-1) approximation circuit 10APP may generate approximation signal 10BAS based on the one or more contributory signals. In this example, approximation signal 10BAS may be calculated by applying an AND gate on the contributory signals of the penultimate stage.

In the example of FIG. 5A, approximation circuit 10APP includes one or more halving stages. Each halving stage pertains to a respective stage of an iterative halving process, in which a divisor of the current approximated probability ($P^*_1/2^n$) is iteratively halved.

In this example, the final stage pertains to halving the divisor $2^{12}$=4096 to produce the divisor of the penultimate stage, e.g., $2^{11}$=2048, and so on. Each halving stage is adapted to produce one or more contributory signals, representing an outcome of that stage of the iterative halving process.

Approximation circuit 10APP may generate approximation signal 10BAS based on the one or more contributory signals. In this example, approximation signal 10BAS may be calculated by applying an AND gate on (i) the contributory signal of the penultimate stage and (ii) a random IID signal of the 12 IID signals.

Figure 6:
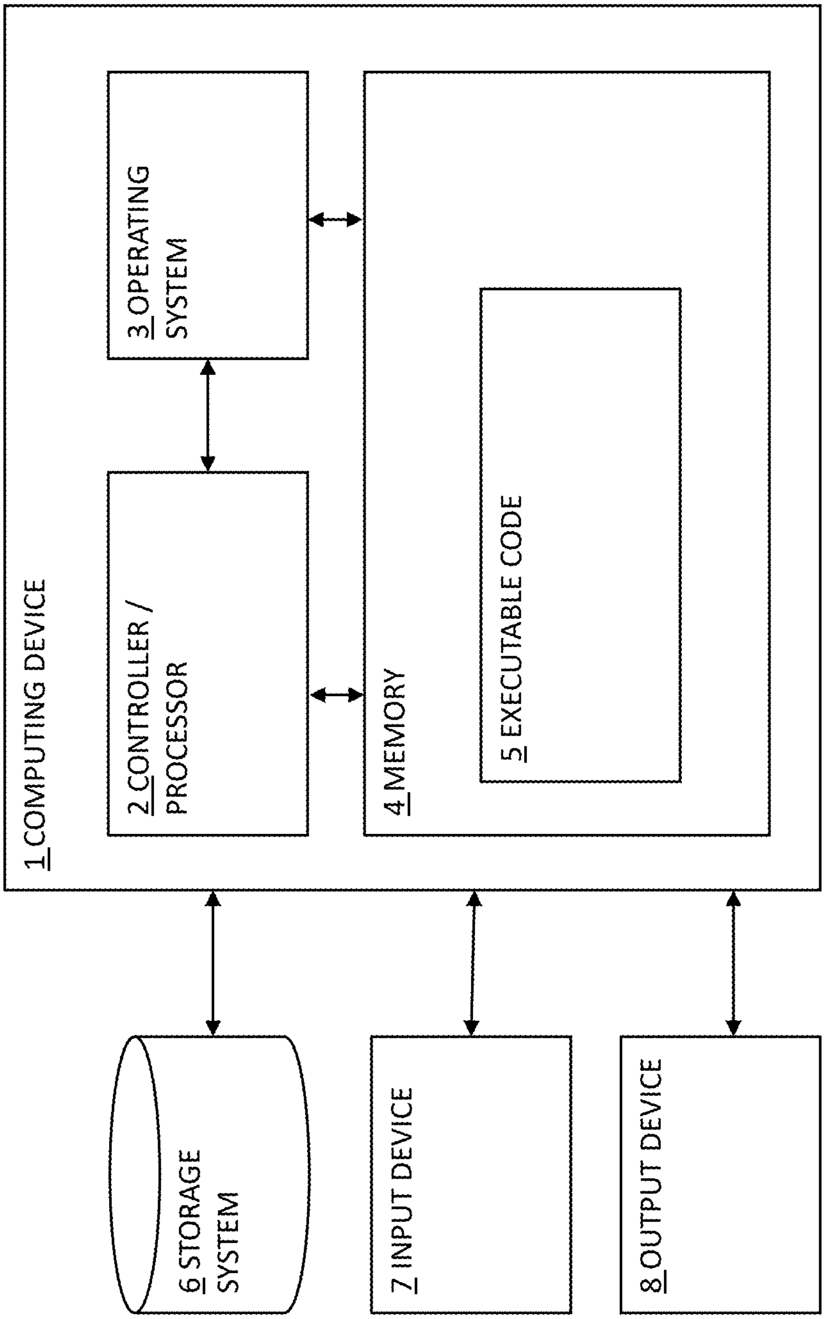
FIG. 6 is a block diagram, depicting a computing device which may be included in a system for designing an electrical circuit, according to some embodiments of the invention.

FIG. 6 is a block diagram, depicting a computing device which may be included in a system for designing an electrical circuit that may generate random binary signals as described herein, according to some embodiments of the invention.

Computing device 1 may include a processor or controller 2 that may be, for example, a central processing unit (CPU) processor, a chip or any suitable computing or computational device, an operating system 3, a memory 4, executable code 5, a storage system 6, input devices 7 and output devices 8. Processor 2 (or one or more controllers or processors, possibly across multiple units or devices) may be configured to carry out methods described herein, and/or to execute or act as the various modules, units, etc. More than one computing device 1 may be included in, and one or more computing devices 1 may act as the components of, a system according to embodiments of the invention.

Operating system 3 may be or may include any code segment (e.g., one similar to executable code 5 described herein) designed and/or configured to perform tasks involving coordination, scheduling, arbitration, supervising, controlling or otherwise managing operation of computing device 1, for example, scheduling execution of software programs or tasks or enabling software programs or other modules or units to communicate. Operating system 3 may be a commercial operating system. It will be noted that an operating system 3 may be an optional component, e.g., in some embodiments, a system may include a computing device that does not require or include an operating system 3.

Memory 4 may be or may include, for example, a Random-Access Memory (RAM), a read only memory (ROM), a Dynamic RAM (DRAM), a Synchronous DRAM (SD-RAM), a double data rate (DDR) memory chip, a Flash memory, a volatile memory, a non-volatile memory, a cache memory, a buffer, a short term memory unit, a long term memory unit, or other suitable memory units or storage units. Memory 4 may be or may include a plurality of possibly different memory units. Memory 4 may be a computer or processor non-transitory readable medium, or a computer non-transitory storage medium, e.g., a RAM. In one embodiment, a non-transitory storage medium such as memory 4, a hard disk drive, another storage device, etc. may store instructions or code which when executed by a processor may cause the processor to carry out methods as described herein.

Executable code 5 may be any executable code, e.g., an application, a program, a process, task, or script. Executable code 5 may be executed by processor or controller 2 possibly under control of operating system 3. For example, executable code 5 may be an application that may be adapted to design an electrical circuit 10, as described herein. Although, for the sake of clarity, a single item of executable code 5 is shown in FIG. 6, a system according to some embodiments of the invention may include a plurality of executable code segments similar to executable code 5 that may be loaded into memory 4 and cause processor 2 to carry out methods described herein.

Storage system 6 may be or may include, for example, a flash memory as known in the art, a memory that is internal to, or embedded in, a micro controller or chip as known in the art, a hard disk drive, a CD-Recordable (CD-R) drive, a Blu-ray disk (BD), a universal serial bus (USB) device or other suitable removable and/or fixed storage unit. Data representing requirements for designing electrical circuit 10 may be stored in storage system 6 and may be loaded from storage system 6 into memory 4 where it may be processed by processor or controller 2. In some embodiments, some of the components shown in FIG. 1 may be omitted. For example, memory 4 may be a non-volatile memory having the storage capacity of storage system 6. Accordingly, although shown as a separate component, storage system 6 may be embedded or included in memory 4.

Input devices 7 may be or may include any suitable input devices, components, or systems, e.g., a detachable keyboard or keypad, a mouse and the like. Output devices 8 may include one or more (possibly detachable) displays or monitors, speakers and/or any other suitable output devices. Any applicable input/output (I/O) devices may be connected to Computing device 1 as shown by blocks 7 and 8. For example, a wired or wireless network interface card (NIC), a universal serial bus (USB) device or external hard drive may be included in input devices 7 and/or output devices 8. It will be recognized that any suitable number of input devices 7 and output device 8 may be operatively connected to Computing device 1 as shown by blocks 7 and 8.

A system according to some embodiments of the invention may include components such as, but not limited to, a plurality of central processing units (CPU) or any other suitable multi-purpose or specific processors or controllers (e.g., similar to element 2), a plurality of input units, a plurality of output units, a plurality of memory units, and a plurality of storage units.

Figure 7:
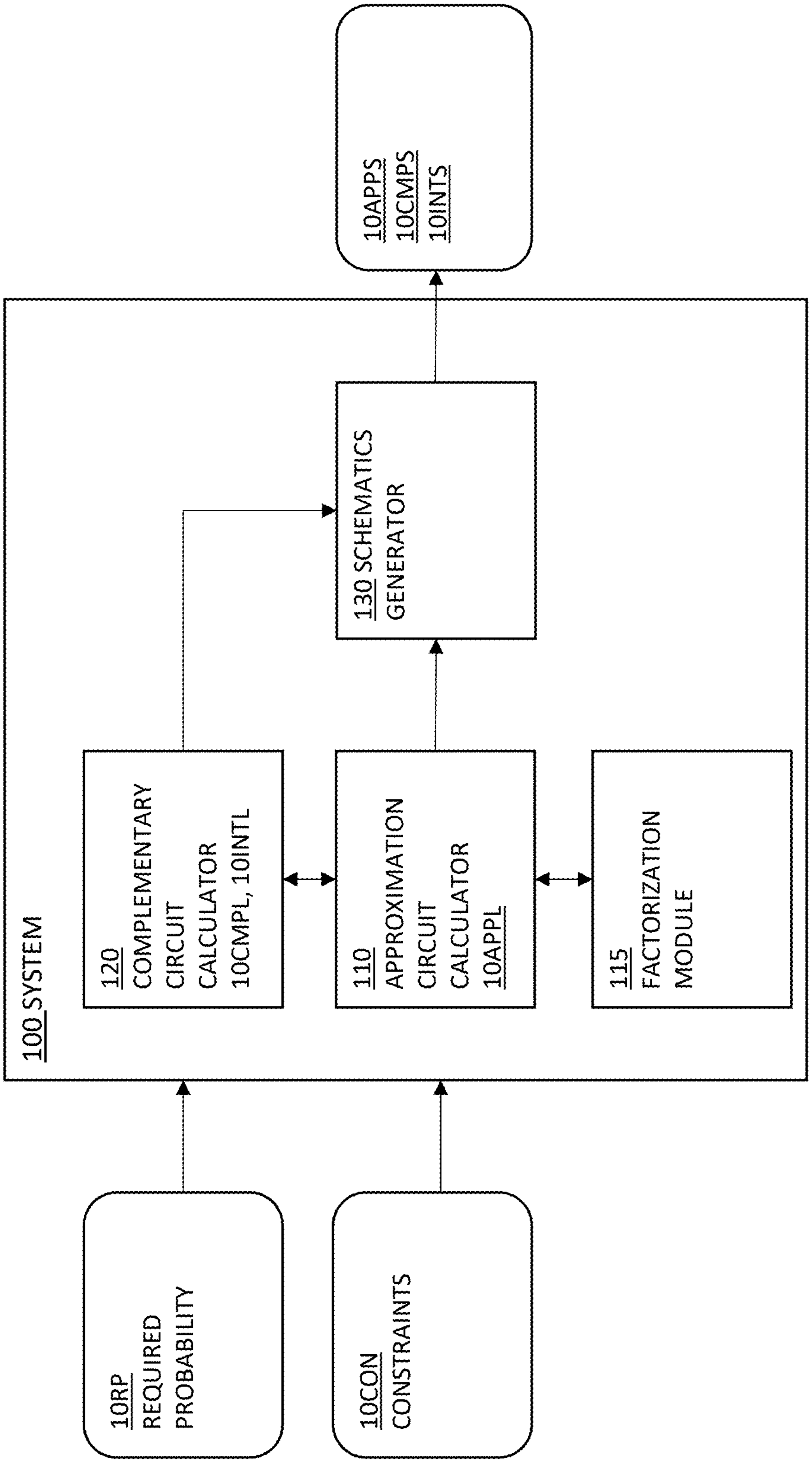
FIG. 7 is a block diagram, depicting a system for designing an electrical circuit, according to some embodiments of the invention.

Reference is now made to FIG. 7, which depicts a system 100 for designing an electrical circuit 10 (e.g., electrical circuit 10 of FIGS. 2A, 3A, 4A, 4B), as described herein, according to some embodiments of the invention.

According to some embodiments of the invention, system 100 may be implemented as a software module, a hardware module, or any combination thereof. For example, system 100 may be, or may include a computing device such as element 1 of FIG. 6, and may be adapted to execute one or more modules of executable code (e.g., element 5 of FIG. 6) to design an electrical circuit 10, as described herein.

As shown in FIG. 7, arrows may represent flow of one or more data elements to and from system 100, and/or among modules or elements of system 100. Some arrows have been omitted in FIG. 7 for the purpose of clarity.

According to some embodiments, system 100 may receive (e.g., via input 7 of FIG. 6) a definition of one or more required probabilities 10RP. In other words, system 100 may receive a definition of a distribution of required probabilities 10RP.

The distribution of required probabilities 10RP is also denoted herein as $\{(P_1/N), \ldots, (P_k/N)\}$, which may be approximated $(\{(P^*_1/2^n), \ldots, (P^*_k/2^n)\})$ by signals $\{S_1, \ldots, S_k\}$ of distribution vector $V_N$.

Additionally, or alternatively, system 100 may receive (e.g., via input 7 of FIG. 6) a definition of one or more hardware constraints 10CON of circuit 10.

For example, constraints 10CON may include a number of bits (e.g., 'n', the number of IID signals) that may be utilized by circuit 10 for approximating required probabilities 10RP. In the example of FIGS. 2A-2B and 3A-3D, the number of bits n are 7 and 10, respectively. As explained herein, the number of bits n may dictate accuracy of approximation of required probabilities 10RP by signals $S_i$ of distribution vector $V_N$.

In another example, hardware constraints 10CON may further include a depth (e.g., a number of stages) of circuit 10 (e.g., of approximation circuit 10APP, complementary circuit 10CMP and/or integration circuit 10INT). In the example of FIGS. 3B-1, and 3C, the depth of approximation circuit 10APP is 4, and the depth of complementary circuit 10CMP is 1. In the example of FIG. 5A, the depth of approximation circuit 10APP is 3.

As shown in FIG. 7, system 100 may include an approximation circuit calculation module 110 (or "module 110", for short). Module 110 may calculate the best approximation for approximation signal 10BAS, given hardware constraints 10CON.

Pertaining to the example of FIG. 5A, module 110 may receive a requirement for approximating a probability 10RP distribution (⅓, ⅓, ⅓), given the constraints of using 13 bits (13 IID signals). As explained herein (e.g., in relation to FIG. 2A, 2B), one bit may be reserved for complementary circuit 10CMP. Therefore, module 110 may calculate the best approximation of a biased, ⅓ probability using 12 bits, i.e., $1365/4096$.

Module 110 may collaborate with a factorization module 115, adapted to perform an iterative factorization process of the output stage representation (e.g., $1365/4096$), so as to determine a composition (e.g., determine a logic design) of approximation circuit 10APP (denoted 10APPL), as explained herein (e.g., in relation to FIG. 3B-1).

Approximation circuit calculation module 110 may further determine composition of approximation circuit 10APP based on criteria of computational resource consumption (e.g., minimal latency and/or space), e.g., by employing De-Morgan law, as elaborated herein (e.g., in relation to FIGS. 3B-2 and 3B-3).

Module 110 may further collaborate with a complementary circuit calculation module 120 (or "module 120", for short), to determine the composition (e.g., determine a logic design of) of complementary circuit 10CMP and/or integration circuit 10INT (denoted 10CMPL and 10INTL, respectively).

Pertaining to the example of FIG. 2A, module 120 may calculate the composition of complementary circuit 10CMP (e.g., a single NOR gate), to produce a complementary signal 10CS that complements the biased probability (⅓, ⅔) of approximation signal 10BAS, as explained herein. Module 120 may further calculate the content of integration circuit 10INT (e.g., implement the truth table of FIG. 2A), so as to produce signals $\{S_1, \ldots, S_k\}$ of distribution vector $V_N$, thereby approximating $(\{(P^*_1/2^n), \ldots, (P^*_k/2^n)\})$ required probability distribution 10RP $\{(P_1/N), \ldots, (P_k/N)\}$.

As shown in FIG. 7, system 100 may include a schematics generator module 130, adapted to calculate schematics of electrical circuits, based on a given logic design.

For example, schematics generator 130 may be adapted to calculate an approximation circuit schematic 10APPS, representing an approximation circuit 10APP, based on logic design 10APPL. The represented approximation circuit 10APP may be adapted to receive one or more first IID binary signals, and generate therefrom a randomly distributed binary approximation signal, as defined by required probability 10RP and constraints 10CON.

Additionally, or alternatively, schematics generator 130 may be adapted to calculate one or more complementary schematics 10CMPS, respectively representing one or more complementary circuits 10CMP, based on complementary circuit logic designs 10CMPL.

The represented complementary circuits may each be configured to receive (i) a binary approximation signal 10BAS of approximation circuit 10APP, and (ii) at least one IID binary signal, and generate therefrom at least one respective random, binary complementary signal 10CS, as explained herein.

Additionally, or alternatively, schematics generator 130 may be adapted to calculate an integration schematic 10INTS, representing an integration circuit 10INT, based on the integration circuit logic design 10INTL. The represented integration circuit may be configured to produce a bus of random binary signals $\{S_1, \ldots, S_k\}$, denoted herein as distribution vector $V_N$.

As explained herein, signals $\{S_1, \ldots, S_k\}$ may be constructed based on approximation signal 10BAS and the one or more complementary signals 10CS, and may have (or may approximate) the required, non-binary probabilities 10RP.

Probabilities 10RP of signals $\{S_1, \ldots, S_k\}$ may, or may not add-up to complete 100%. Pertaining to the example of FIG. 4A, the probability distribution of signals $\{S_1, \ldots S_5\}$ of vector $V_5$ may be (⅕, ⅖, ⅕, ⅕, ⅕), to select or enable hardware modules $\{M_1, \ldots, M_5\}$, according to a respective, desired configuration.

Additionally, or alternatively, schematics generator 130 may obtain one or more schematics, representing respective hardware components (e.g., {M1, . . . , M5}), intended to be integrated within an IC. Schematics generator 130 may associate, or connect schematics of hardware components (e.g., {M1, . . . , M5}) to integration circuit schematics 10INTS. Schematics generator 130 may thereby configure the integration circuit 10INT to select, or enable the one or more hardware components, via the bus of random binary signals $V_N$, based on the required, non-binary probabilities 10RP.

Schematics 10APPS, 10CMPS, 10INTS may be adapted to be subsequently translated into a physical layout design. As known in the art, such a physical layout design may be utilized in a fabrication process, to generate circuit 10 as a device, or as part of Integrated Circuit (e.g., a chip).

FIG. 8 is a flow diagram, depicting a method of designing an electrical circuit, according to some embodiments of the invention by at least one processor (e.g., processor 2 of FIG. 6).

As shown in step S1005, the at least one processor 2 may receive (e.g., via input 7 of FIG. 6) a definition of a required probability distribution 10RP. The at least one processor 2 may calculate an approximation circuit schematic (e.g., 10APPS of FIG. 7), representing an approximation circuit (e.g., 10APP of FIGS. 2B, 3B-1, 3B-2, 3B-3, 5A). As explained herein, approximation circuit 10APP may be adapted to receive one or more first IID binary signals, and generate therefrom a randomly distributed binary approximation signal (e.g., 10BAS of FIGS. 2B, 3B-1, 3B-2, 3B-3, 5A).

As shown in step S1010, the at least one processor 2 may subsequently calculate or generate one or more complementary schematics 10CMPS, respectively representing one or more complementary circuits 10CMP. As explained herein, each complementary circuit may be configured to receive (i) the binary approximation signal 10BAS, and (ii) at least one second IID binary signal, and generate therefrom at least one respective random, binary complementary signal 10CS. As explained herein, complementary signals 10CS may complement the probability of binary approximation signal 10BAS, in accordance with the required probability 10RP.

In some embodiments, complementary signals 10CS may be output as signals (denoted $\{S_1, \ldots S_k\}$) of a bus of random binary signals, having the required probability distribution 10RP.

Additionally, or alternatively, the at least one processor 2 may calculate (step S1015) an integration schematic (e.g., 10INTS of FIG. 7), representing an integration circuit (e.g., 10INTS of FIGS. 2A, 3D, 4A, 4B), configured to produce the bus of random binary signals (denoted herein as $V_N$), having the required, non-binary probabilities 10RP, based on the approximation signal and the one or more complementary signals.

Additionally, or alternatively, the at least one processor 2 may obtain (step S1020) one or more schematics, representing one or more respective hardware components (e.g., M1, . . . , M5), that are to be integrated within the IC.

The at least one processor 2 may configure the integration circuit schematic 10INTS so as to connect the bus of random binary signals $V_N$ to such to the respective hardware components (e.g., M1, . . . , M5). The at least one processor 2 may thereby configure the integration circuit 10INT to select, or enable the one or more hardware components, via the bus of random binary signals $V_N$, based on the required, non-binary probabilities 10RP.

Unless explicitly stated, the method embodiments described herein are not constrained to a particular order or sequence. Furthermore, all formulas described herein are intended as examples only and other or different formulas may be used. Additionally, some of the described method embodiments or elements thereof may occur or be performed at the same point in time.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

Various embodiments have been presented. Each of these embodiments may of course include features from other embodiments presented, and embodiments not specifically described may include various features described herein.

The invention claimed is:

1. A device for generating a bus of randomly distributed binary signals $\{S_1, S_2, \ldots S_k\}$, defined by a vector $V_N$ of respective, required, rational-number probabilities $\{(P_1/N), (P_2/N), \ldots, (P_k/N)\}$, the device comprising:

an approximation circuit, configured to receive one or more first, Independent, and Identically Distributed (IID) binary signals, and generate therefrom an approximation signal that is random and binary, wherein a probability of the approximation signal is biased based on an integer common denominator N;

one or more complementary circuits, each configured to receive (i) the approximation signal, and (ii) at least one second IID binary signal, and generate therefrom one or more complementary signals that are random and binary; and an integration circuit, configured to produce the bus of random binary signals $\{S_1, S_2, \ldots S_k\}$, based on the approximation signal and the one or more complementary signals, in accordance with the vector $V_N$ of required probabilities.

2. The device of claim 1, wherein $\{P_1, P_2, \ldots, P_k\}$ are integer numbers, and wherein at least one of the required probabilities $\{(P_1/N), (P_2/N), \ldots, (P_k/N)\}$ is non-binary in a sense that it cannot be accurately represented as a rational fraction, with a denominator of a power of 2.

3. The device of claim 1, wherein the approximation circuit is configured to generate binary values of the approximation signal at an approximated probability $(P^*_1/2^n)$, which approximates probability $(P_1/N)$ of a first random binary signal S1 of the bus of random binary signals $\{S_1, S_2, \ldots S_k\}$, given a predetermined number of bits n.

4. The device of claim 3, wherein the one or more complementary signals are adapted to complement the probability of the approximation signal, in accordance with the required probabilities $\{(P_2/N), \ldots, (P_k/N)\}$ of signals $\{S_1, S_2, \ldots S_k\}$ of the bus of random binary signals $\{S_1, S_2, \ldots S_k\}$.

5. The device of claim 3, wherein the approximation circuit comprises one or more factorization stages, wherein each factorization stage (a) pertains to a respective step of iterative factorization of the approximated probability $(P^*_1/2^n)$, and (b) is adapted to produce one or more contributory signals, representing that step of iterative factorization, and wherein the approximation circuit is adapted to generate the approximation signal based on the one or more contributory signals.

6. The device of claim 3, wherein the approximation circuit comprises one or more halving stages, and wherein each halving stage (a) pertains to a respective step of iterative halving of the approximated probability $(P^{*1}/2^n)$, and (b) is adapted to produce one or more contributory signals, representing that step of iterative halving, and wherein the approximation circuit is adapted to generate the approximation signal based on the one or more contributory signals.

7. The device of claim 1, wherein the device is connected with one or more hardware components via the bus of random binary signals, and wherein the device is adapted to generate the bus's random binary signals so as to select, or enable the one or more hardware components in accordance with the vector $V_N$ of required probabilities.

8. An Integrated Circuit (IC) comprising a first device of claim 1, and one or more second devices of claim 1, wherein the integration circuit of the first device is configured to produce the random binary signals $\{S_1, S_2, \ldots S_k\}$, based on approximation signals and complementary signals of the first device and the one or more second devices, as a combination of vectors $V_N$ of required probabilities, said vectors VN of required probabilities pertaining to the first device and the one or more second devices.

9. The IC of claim 8, further comprising one or more hardware components, associated with the first device and the one or more second devices via their respective buses of randomly distributed binary signals, so as to enable selection or function of the one or more hardware components in accordance with said combination of vectors $V_N$ of required probabilities.

10. A method of producing, by at least one processor, an Integrated Circuit (IC), the method comprising:

calculating an approximation circuit schematic, representing an approximation circuit, adapted to receive one or more first Independent, and Identically Distributed (IID) HID binary signals, and generate therefrom an approximation signal that is binary and randomly distributed;

calculating one or more complementary schematics, respectively representing one or more complementary circuits, wherein each complementary circuit is configured to receive (i) the approximation signal, and (ii) at least one second IID binary signal, and generate therefrom one or more respective complementary signals that are random and binary;

calculating an integration schematic, representing an integration circuit, configured to produce a bus of random binary signals, having required, non-binary probabilities, based on the approximation signal and the one or more complementary signals; and translating said schematics into a physical layout design, utilizable for fabricating the IC.

11. The method of claim 10, further comprising:
obtaining one or more schematics, representing one or more respective hardware components, intended to be integrated within the IC; and
configuring the integration circuit to select, or enable the one or more hardware components, via the bus of random binary signals, based on the required, non-binary probabilities.

12. A system for producing an Integrated Circuit (IC), the system comprising:
a non-transitory memory device, wherein modules of instruction code are stored, and at least one processor associated with the memory device, and configured to execute the modules of instruction code, whereupon execution of said modules of instruction code, the at least one processor is configured to:
calculate an approximation circuit schematic, representing an approximation circuit, adapted to receive one or more first Independent, and Identically Distributed (IID) HID binary signals, and generate therefrom an approximation signal that is binary, and randomly distributed;
calculate one or more complementary schematics, respectively representing one or more complementary circuits, wherein each complementary circuit is configured to receive (i) the approximation signal, and (ii) at least one second IID binary signal, and generate therefrom one or more respective complementary signals that are random and binary;
calculate an integration schematic, representing an integration circuit, configured to produce a bus of random binary signals, having required, non-binary probabilities, based on the approximation signal and the one or more complementary signals; and
translating said schematics into a physical layout design, utilizable for fabricating the IC.

13. The system of claim 12, wherein the at least one processor is further configured to:
obtain one or more schematics, representing one or more respective hardware components, intended to be integrated within the IC; and
configure the integration circuit to select, or enable the one or more hardware components, via the bus of random binary signals, based on the required, non-binary probabilities.

* * * * *